United States Patent [19]

Kasa

[11] Patent Number: 5,247,476
[45] Date of Patent: Sep. 21, 1993

[54] SEMICONDUCTOR MEMORY DEVICE HAVING A MASK ROM AND A PROM

[75] Inventor: Yasushi Kasa, Kawasaki, Japan
[73] Assignee: Fujitsu Limited, Kanagawa, Japan
[21] Appl. No.: 584,312
[22] Filed: Sep. 18, 1990
[30] Foreign Application Priority Data

Sep. 18, 1989 [JP] Japan .................................. 1-240956

[51] Int. Cl.[5] ........................................... G11C 17/00
[52] U.S. Cl. ..................................... 365/104; 365/94; 365/189.01
[58] Field of Search ...................... 365/94, 104, 189.01, 365/96

[56] References Cited

U.S. PATENT DOCUMENTS 4,744,054 5/1988 Kawata et al. ...................... 365/104
4,811,303 3/1989 Hirai ................................. 365/94 X

FOREIGN PATENT DOCUMENTS 178948 4/1986 European Pat. Off. .
254602 1/1988 European Pat. Off. .
355768 2/1990 European Pat. Off. .
62-279598 12/1987 Japan .
1-243295 9/1989 Japan .

OTHER PUBLICATIONS

Japanese Patent Abstracts of Japan, vol. 13, No. 580, Dec. 21, 1989, JP880069250, Nakamura Tomoharu, "Mask Rom Device".
Electro, 8079 IEEE, vol. 7 (1982), May, N.Y., "Implementation of On-chip Redundancy Using Laser Fusing Techniques", James R. Flynn, pp. 1-5.

*Primary Examiner*—Joseph A. Popek
*Attorney, Agent, or Firm*—Nikaido, Marmelstein, Murray & Oram

[57] ABSTRACT

A semiconductor memory device with a mask ROM and a PROM whose program characteristics are different is provided with a switching means. The switching operation is performed so that the content of the mask ROM becomes effective when the mask ROM is programmed and so that the content of the PROM becomes effective when the RPOM is programmed. Thereby, both mask ROM and PROM become programmable, making the semiconductor memory device with mask ROM and PROM effectively operative.

22 Claims, 15 Drawing Sheets

Fig. 4

| A19 | A18 | A17 | A16 | A15 | A14 | A13 | A12 | A11 | A10 | A9 | A8 |
|-----|-----|-----|-----|-----|-----|-----|-----|-----|-----|----|----|
| 0 | 0 | 1 | 0 | 1 | 0 | 1 | 0 | 0 | 1 | 1 | 0 |

| A19 | A18 | A17 | A16 | A15 | A14 | A13 | A12 | A11 | A10 | A9 | A8 |
|-----|-----|-----|-----|-----|-----|-----|-----|-----|-----|----|----|
| 1 | 0 | 0 | 0 | 1 | 1 | 0 | 0 | 0 | 0 | 1 | 1 |

(20)

| KINDS OF MROM | WHEN PROGRAMMED | SYMBOL |
|---|---|---|
| ION IMPLANTATION (HIGH VTH) | CURRENT DOES NOT FLOW | B |
| ION IMPLANTATION (DEPLETION TYPE) | CURRENT FLOWS | A |
| EXISTANCE OF CONTACT UNIT | CURRENT FLOWS (CONTACT UNIT EXISTS) | A |
| EXISTANCE OF DIFFUSION LAYER | CURRENT FLOWS (DIFFUSION LAYER EXISTS) | A |

Fig.7

| KINDS OF PROM | WHEN PROGRAMMED | SYMBOL |
|---|---|---|
| EPROM | CURRENT DOES NOT FLOW | B |
| E² PROM | CURRENT DOES NOT FLOW | B |
| FUSE CUT OFF (ELECTRIC/LASER) | CURRENT DOES NOT FLOW | B |
| PN JUNCTION DESTROYED | CURRENT FLOWS | A |
| INSULATION LAYER DESTROYED | CURRENT FLOWS | A |

Fig.8

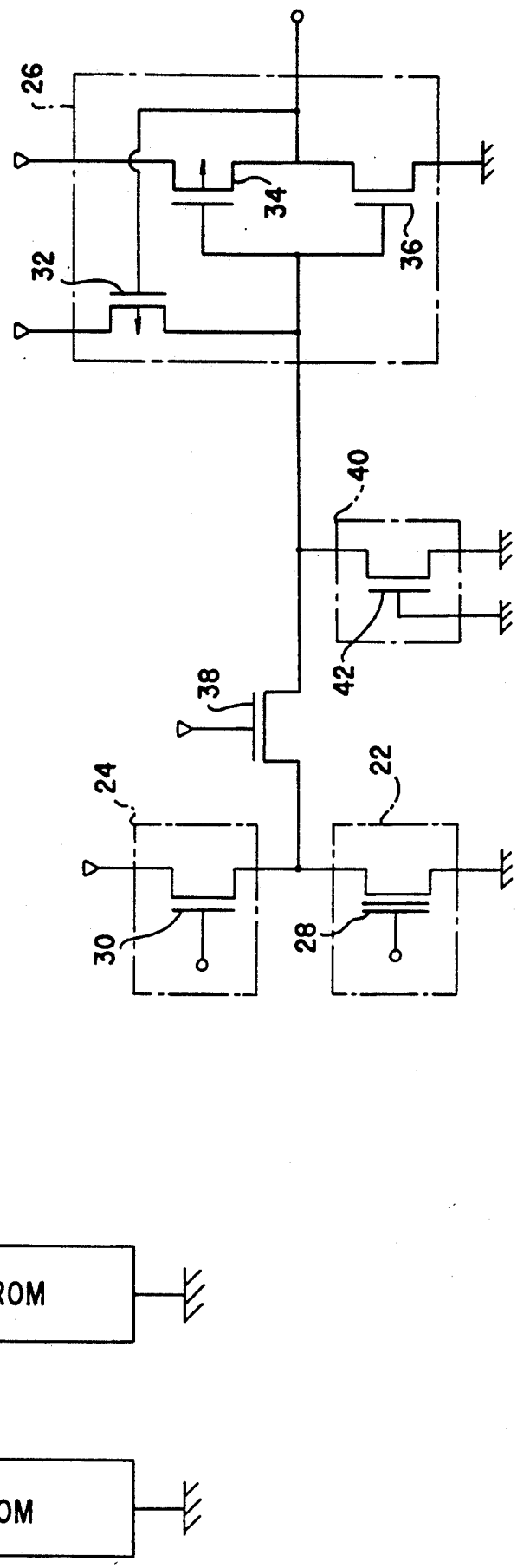
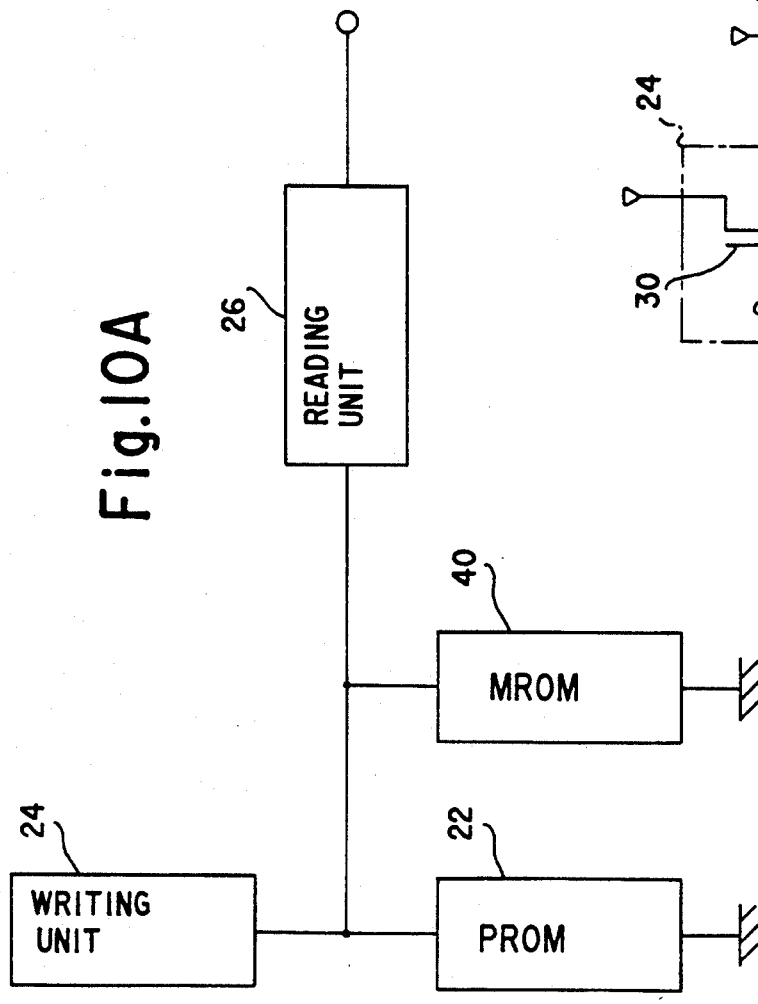
Fig.10A
Fig.10B

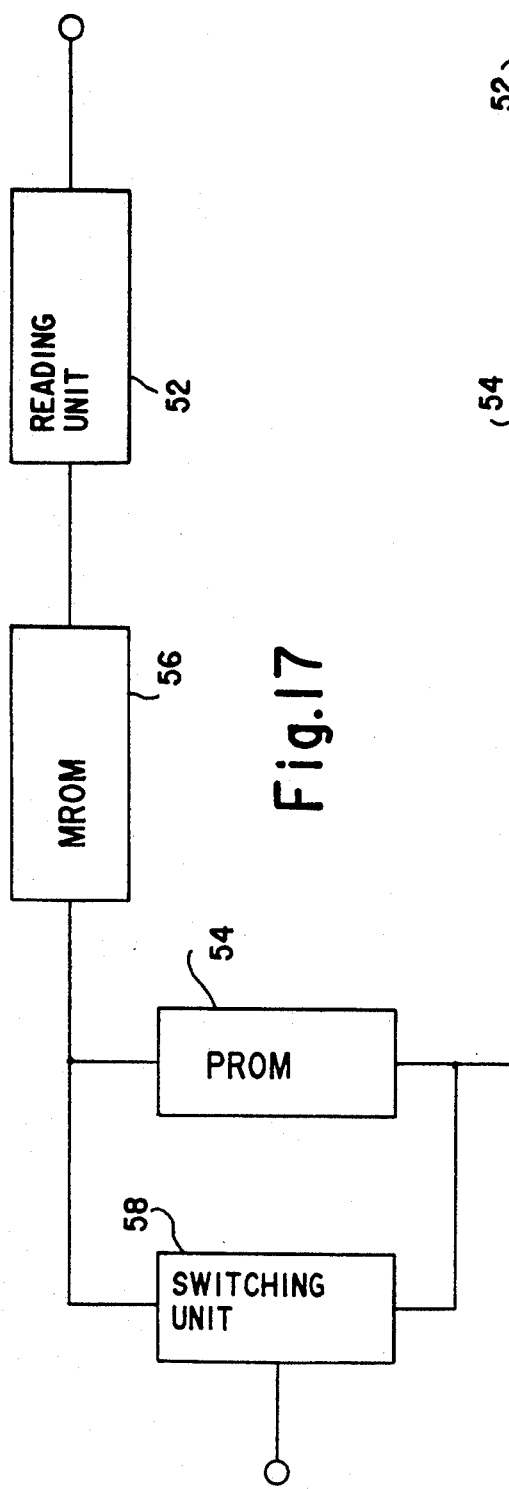
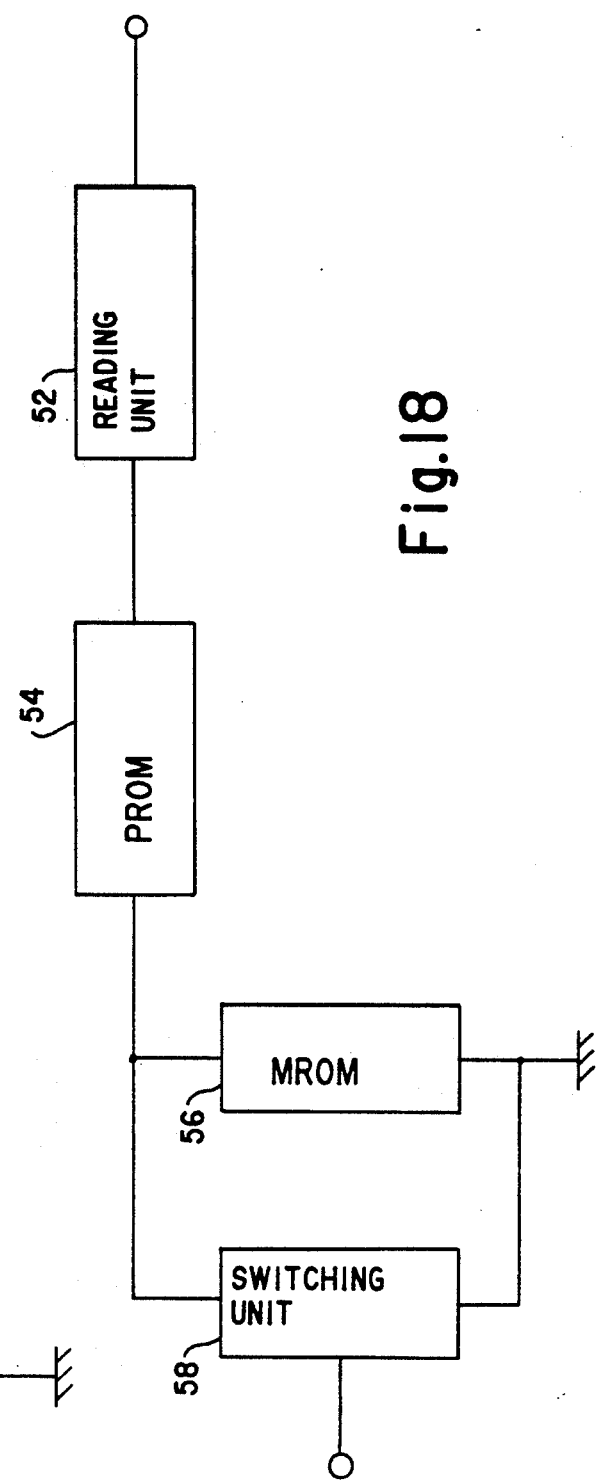

SEMICONDUCTOR MEMORY DEVICE HAVING A MASK ROM AND A PROM

The present invention relates to a semiconductor memory device and more particularly to a semiconductor memory device with a mask ROM and a PROM.

A ROM includes a non-volatile memory element (mask ROM (MROM)) for determining a memory content in a manufacturing process, and a non-volatile memory element (programmable ROM (PROM)) for writing the memory content after the manufacturing process is completed. Recently there has been demand for a part of the address region of a mask ROM (which may be abbreviated MROM) to be made programmable (i.e. to be made into a PROM). In this case, an address storing unit comprising both a MROM and a PROM, must make its MROM and PROM both programmable is A mask ROM cell is usually used as the address storing unit of such a semiconductor device. However, demand has recently increased for the address storing unit to be made programmable. Where a PROM other than a mask ROM is provided for the address storing unit, the address storing unit cannot be made programmable by a mask ROM and a PROM as the programming characteristics of a mask ROM and a PROM are different. There is a case where the address region of a ROM is determined upon receiving the data of the mask ROM and there is a case where the address region of the ROM is individually different. In the address storing unit with both mask ROM and PROM, it is necessary that it be made programmable in both mask ROM and PROM.

FIG. 1 shows the structure of a semiconductor memory device in which a part of the address region of the mask ROM is made programmable.

In FIG. 1, 10 and 12 respectively designate a first memory unit and a second memory unit. These memory units 10 and 12 are controlled by a control circuit 14 and the memory content is output to a data buffer 16. 18 and 20 respectively designate an address buffer and an address storing unit. The control circuit 14 compares an input address from the address buffer 18 with a stored address from the address storing unit 20. When they are identical, the second memory unit 12 is accessed. When they are not identical, the first memory unit 10 is accessed.

The address storing unit 20 in FIG. 1 is formed of a mask ROM and recently a part of the address region of the address storing unit 20 has been formed of a PROM. A method for providing a redundancy is to use the PROM as a part of the address storing unit 20. The method of simultaneously writing address information and data into the mask ROM is disclosed in Japanese Patent Disclosure Number 62-279598.

For reference, the address storing unit 20 is explained by referring to the following example.

Let's consider a semiconductor memory device internally equipped with a mask ROM (cell array) of 1M words×16 bits, and a PROM (cell array) of 256 words×16 bits. When 256 words of the 1M-word address region are replaced by the PROM, and for example, the region of #2A600–#2A6FF is replaced by the PROM, the structure becomes as shown in FIG. 2 when observed outside the chip and can be expressed as shown in FIG. 3 (corresponding to FIG. 1) from inside the chip. In this case, it is necessary to store addresses A8–A19 out of addresses A0–A19 in address storing unit 20. Therefore, as shown in FIG. 4, 12 bits corresponding to A8–A19 are necessary. Thus, the value of 12 bits (#2A6) is stored in address storing unit 20. For example, when 256 words of #8C300–#8C3FF are replaced by PROM, the value (#8C3) of 12 bits is stored as shown in FIG. 5. "1" or "0", shown in FIGS. 4 and 5, designate that the content stored in respective cells of address storing unit 20 are "1" or "0". The content stored in the address storing unit determines which address region should be replaced by PROM and the value of the address is discretionally determined from a usage by the user.

To store the value in address storing unit 20, a mask ROM cell may be used to correspond to the mask ROM (first memory unit 10) or a PROM cell may be used to correspond to the PROM (second memory unit 12).

Next, for reference, an application in which a part of the mask ROM (first memory unit 10) is replaced by the PROM (second memory unit 12) is explained.

In this application, there are cases where (i) user definition information is stored (the mask ROM cell is used as an address storing unit 20), (ii) a user corrects data (the PROM cell is used as an address storing unit 20), (iii) a fault is saved (the PROM cell is used as address storing unit 20), for example. If only one second memory unit 12 is provided, it is used for one of the above applications and not for the other. As shown in FIG. 6, if a plurality of (m) second memory units, address storing units and control circuits are provided, each is used for a particular application.

The following usage examples (1) to (5) are considered for the case of four (m=4) second memories, and the method of usage may be selected depending on the application.

(1) When all the applications (i) (iii) are required,
second memory unit 12-1 is used for an application (i),
second memory unit 12-2 is used for an application (ii),
second memory unit 12-3 is used for an application (iii), and
second memory unit 12-4 is used for an application (iii).

(2) When an application (i) is not necessary,
second memory unit 12-1 is used for an application (iii),
second memory unit 12-2 is used for an application (ii),
second memory unit 12-3 is used for an application (iii), and
second memory unit 12-4 is used for an application (iii).

(3) When two applications of (ii) are required,
second memory unit 12-1 is used for an application (i),
second memory unit 12-2 is used for an application (ii),
second memory unit 12-3 is used for an application (ii), and
second memory unit 12-4 is used for an application (iii).

(4) When two applications of (i) are necessary and an application of (ii) is not necessary,
second memory unit 12-1 is used for an application (i),
second memory unit 12-2 is used for an application (i),
second memory unit 12-3 is used for an application (iii), and
second memory 12-4 is used for an application (iii).

(5) When both (i) and (ii) are unnecessary, second memory unit 12-1 is used for an application (iii), second memory unit 12-2 is used for an application (iii), second memory unit 12-3 is used for an application (iii), and second memory unit 12-4 is used for an application (iii).

If the method of storing in address storing unit 20 uses only the mask ROM cell or only the PROM cell, it is necessary to fix the function so that address storing unit 20-1 is made of the mask ROM and the other address units 20-2–20-4 are formed of the PROM. In the above stated (1)–(5), the following inconveniences are observed.

In (1),
 all the second memory units can be used.

In (2),
 second memory unit 12-1 is not used (and is not used for an application of (iii)),
 second memory unit 12-2 is used for an application (ii),
 second memory unit 12-3 is used for an application (iii),
 third memory unit 12-4 is used for an application (iii).

In (3),
 all second memory units can be used.

In (4),
 second memory unit 12-1 is used for an application (i),
 second memory unit 12-2 is not used (and is not used for an application of (i)),
 second memory unit 12-3 is used for an application (iii),
 third memory unit 12-4 is used for an application (iii).

In (5),
 second memory unit 12-1 is not used (and is not used for an application (iii)),
 second memory unit 12-2 is used for an application (iii),
 second memory unit 12-3 is used for an application (iii),
 third memory unit 12-4 is used for an application (iii).

As described above, even if a region of the second memory unit remains, the region can sometimes not be used and the utilization efficiency of the memory region deteriorates.

If address storing unit 20 is made programmable by the mask ROM cell and the PROM cell, a plurality of second memory units can be used by a discretional utilizing method, thereby increasing the utilization efficiency.

As described above, the address storing unit is formed of the mask ROM and the PROM, and the address storing unit is made programmable by both mask ROM and PROM. However, the mask ROM and PROM sometimes have different program characteristics. For example, as a method of performing a program or a state where the program is completed (namely, whether a current is allowed to flow or is prohibited from flowing) is different, the address storing unit cannot be programmed by the mask ROM and the PROM if they are simply provided on the address storing unit. This point is explained in detail as follows.

FIG. 7 shows a relation between mask ROM and program. FIG. 8 shows a relation between PROM and program.

If PROM and mask ROM are subject to a program, they are changed from the state prior to the programming and the two methods of changing the state are as follows.

(1) The state in which a current does not flow is changed to a state in which the current flows through a programming process (off→on). This case is shown by symbol A in the drawing.

(2) The state in which a current flows is changed to a state in which a current does not flow through a programming process (on→off). This case is shown by symbol B.

There are two methods of achieving a state in which current flows and a state in which current does not flow. These states correspond to logic values "0" and "1". The methods of achieving states corresponding to these logic values are predetermined by considering characteristics of a memory side of a whole apparatus. The address storing unit is required to correspond to the characteristics of the memory side of the apparatus as a whole.

Let us assume, as shown in FIGS. 7 and 8, that ion implantation is performed on a mask ROM to make it of the depletion type and EPROM (for storing a negative charge in floating gate) is selected for PROM. In this case, the mask ROM is caused to enable current to flow when it is programmed and then the logic value is (1). Conversely, the PROM is caused to prevent current from flowing when it is programmed and then the logic value is (0).

FIG. 9 shows an address storing unit using only a PROM. FIGS. 9A and 9B respectively show a block diagram and a detailed circuit diagram.

In FIG. 9A, 22 designates a PROM, 24 a writing unit and 26 a reading unit. As shown in FIG. 9B, the PROM 22 includes a transistor 28 for EPROM, which is made programmable by injecting an electric charge into its floating gate. The writing unit 24 includes a transistor 30. The reading unit 26 includes transistors 32, 34 and 36. 38 designates a transistor for preventing a high voltage from being applied to the reading unit 26 upon a writing.

As shown in FIG. 9, when the address storing unit comprises only a PROM, there is no problem. However, when it comprises both a PROM and a mask ROM whose program characteristics are different, the following problem occurs in case of a parallel connection of a PROM and a mask ROM or a series connection of a PROM and a mask ROM.

FIG. 10 designates an address storing unit in which a PROM and a mask ROM are connected in parallel and FIGS. 10A and 10B, respectively, show a block diagram and a detailed circuit diagram.

In FIG. 10, 40 designates a mask ROM (MROM). The mask ROM 40 includes a transistor 42 which is made programmable by an ion implantation or by being of the depletion type. When the mask ROM 40 is programmed for use and the PROM 22 is not programmed, current is made to flow through the PROM 22, and thus, the PROM 22 is kept in the ON state. Therefore, regardless of the state of the program of the mask ROM 40, the reading circuit 26 always detects an ON state and does not operate as an address storing unit.

FIG. 11 designates an address storing unit connected in series with the PROM 22 and the mask ROM 40 and FIGS. 11A and 11B, respectively, show a block diagram and a detailed circuit diagram.

In FIG. 11, when the PROM 22 is programmed for use, the mask ROM 40 is also required to be programmed and put in the ON state. Therefore, the usage of the PROM 22 is limited by the mask ROM 40 and the PROM does not operate as an address storing unit.

As stated above, where the mask ROM 40 and the PROM 22 have different program characteristics, the address storing unit does not fully function by merely arranging the mask ROM 40 and the PROM 22 in series or in parallel.

This problem also occurs in various kinds of semiconductor memory apparatuses commonly having mask ROMs and PROMs whose program characteristics are different, as well as an address storing unit.

SUMMARY OF THE INVENTION

An object of the present invention is to provide a semiconductor memory apparatus which is made programmable by a mask ROM or a PROM in a semiconductor memory apparatus having a mask ROM and a PROM.

A feature of the present invention resides in a semiconductor memory device comprising a first ROM for allowing current to flow when the first ROM is programmed and a second ROM for prohibiting current from flowing when the second ROM is programmed, switching device for switching the first ROM and the second ROM, and a device for making the content of the first ROM effective when the first ROM is programmed under the control of the switching device and for making the content of the second ROM effective when the second ROM is programmed.

BRIEF DESCRIPTION OF THE DRAWINGS

FIG. 4 shows an example of address data stored in an address storing unit, FIG. 5 shows an another example of address data stored in an address storing unit, FIG. 7 shows a relation between the mask ROM and a program, FIG. 8 shows a relation between the PROM and a program, FIGS. 9A and 9B respectively show a block diagram of an address storing unit using only a PROM, and a detailed circuit diagram thereof, FIGS. 10A and 10B respectively show a block diagram of an address storing unit in which a PROM and a mask ROM are connected in parallel, and a detailed circuit diagram thereof, FIGS. 11A and 11B respectively show a block diagram of an address storing unit in which a PROM and a mask ROM are connected in series, and a detailed circuit diagram thereof, FIG. 17 and FIG. 18 are block diagrams of an address storing unit according to another embodiment of the present invention.

PREFERRED EMBODIMENTS OF THE PRESENT INVENTION

Preferred embodiments of the present invention will be described in detail hereinafter by referring to the attached drawings.

Figure 1:
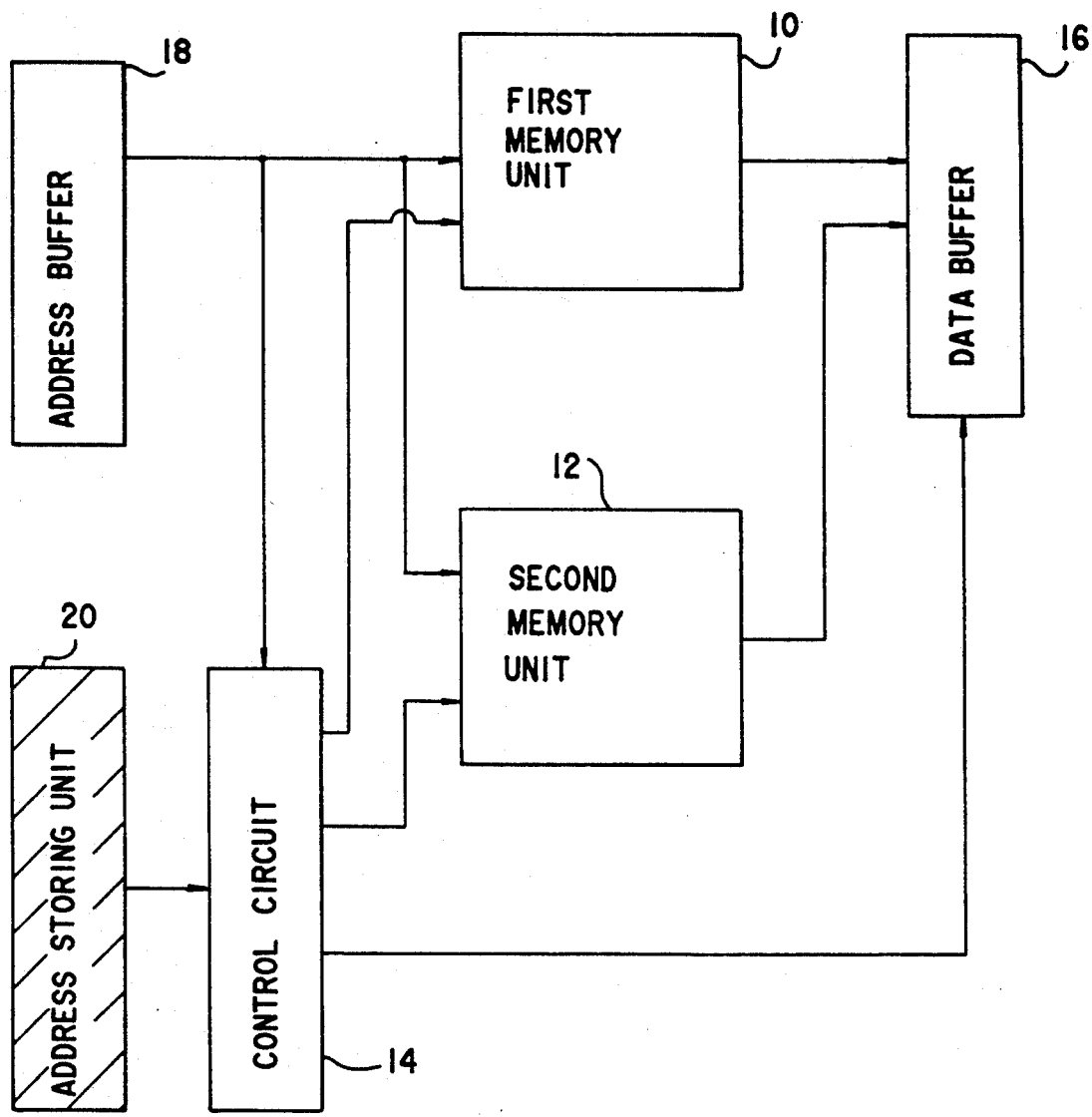
FIG. 1 shows a block diagram of a whole semiconductor memory apparatus in which a part of the address region of a mask ROM is made programmable.
Figures 2, 3:
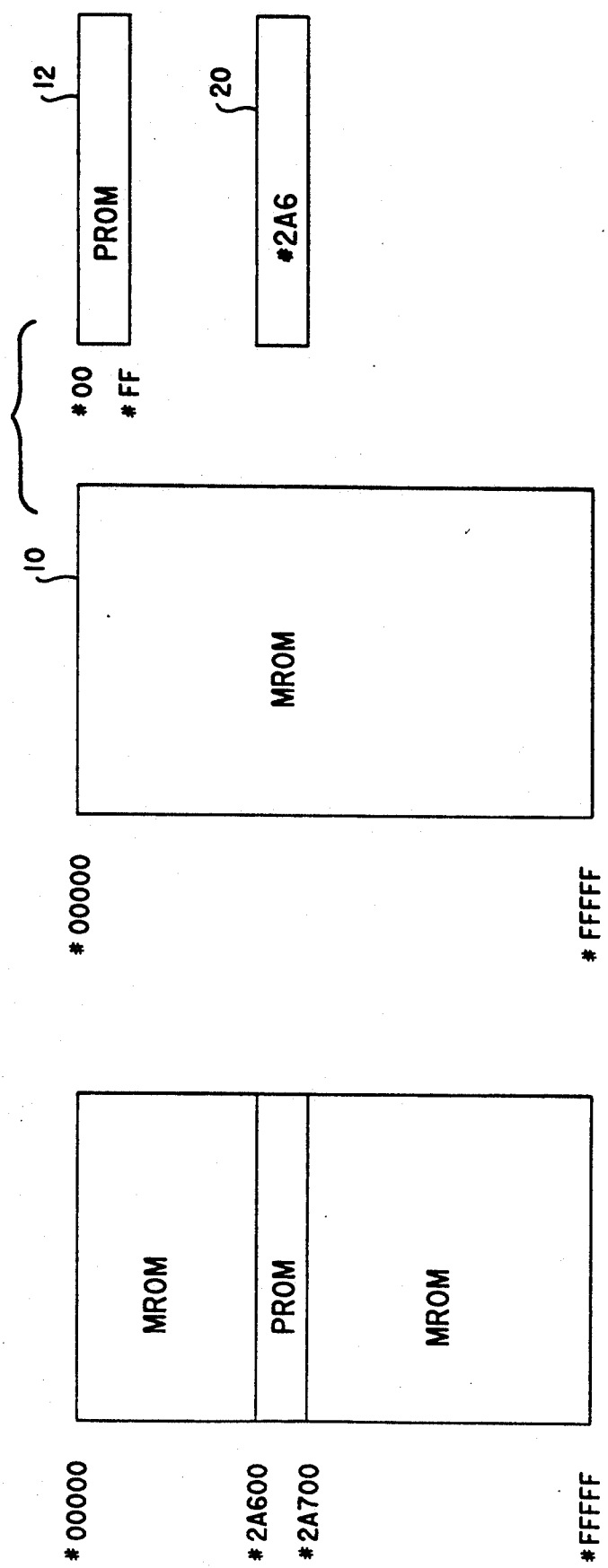
FIG. 2 shows a state in which a part of the mask ROM address region is replaced by a PROM and is viewed from outside the chip.
FIG. 3 shows a state in which a part of the address region of a mask ROM is replaced by a PROM and is viewed from outside the chip.
Figure 6:
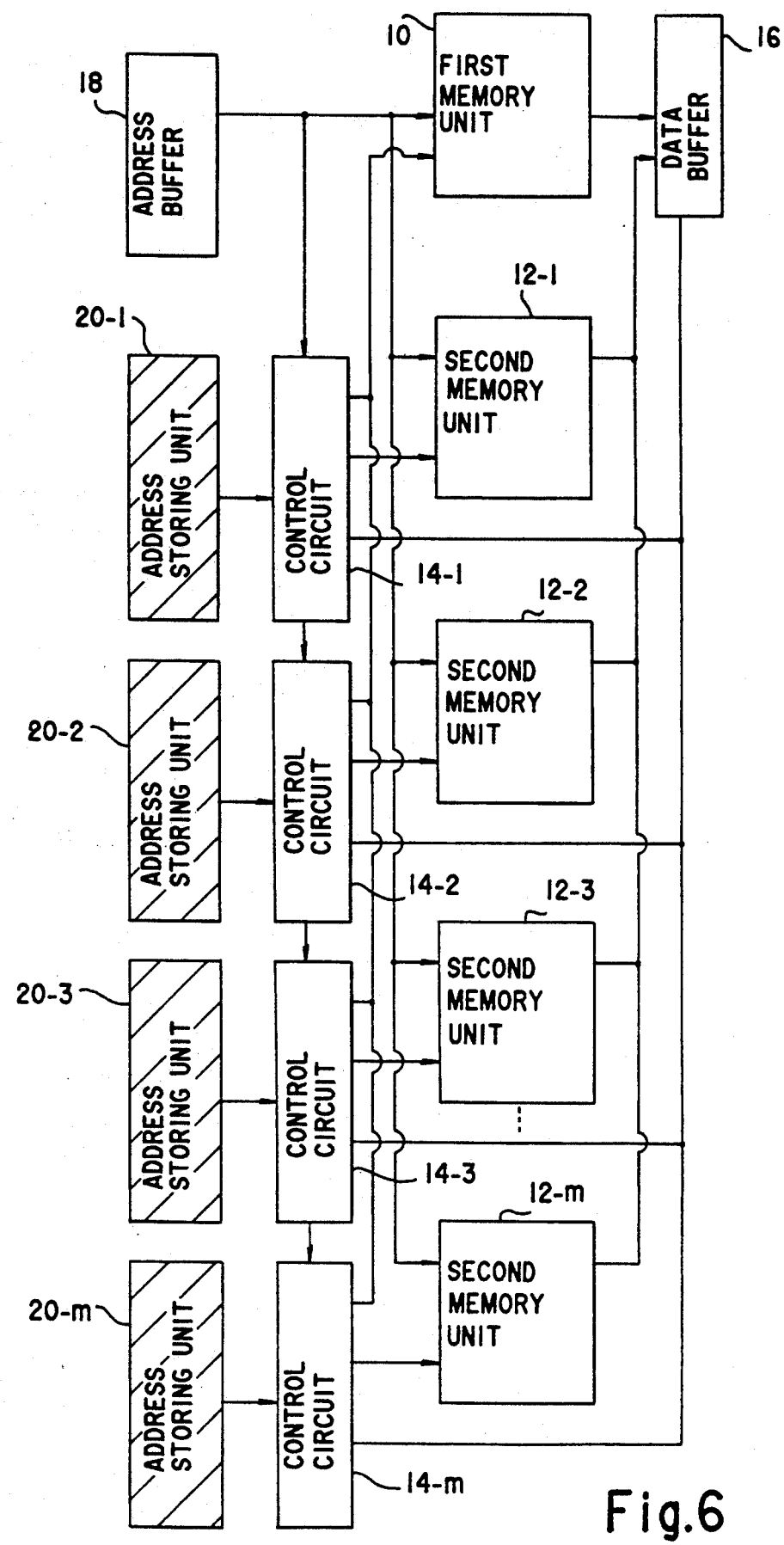
FIG. 6 shows a semiconductor memory apparatus in which a part of the address region of a mask ROM is made programmable and in which a plurality of second memory units (PROMs) are shown.
Figure 9B:
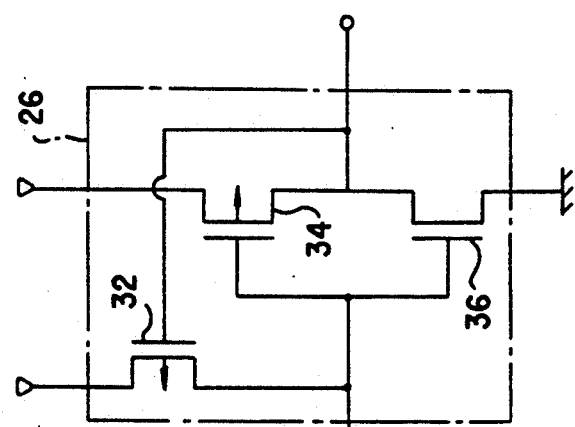
Figure 9A:
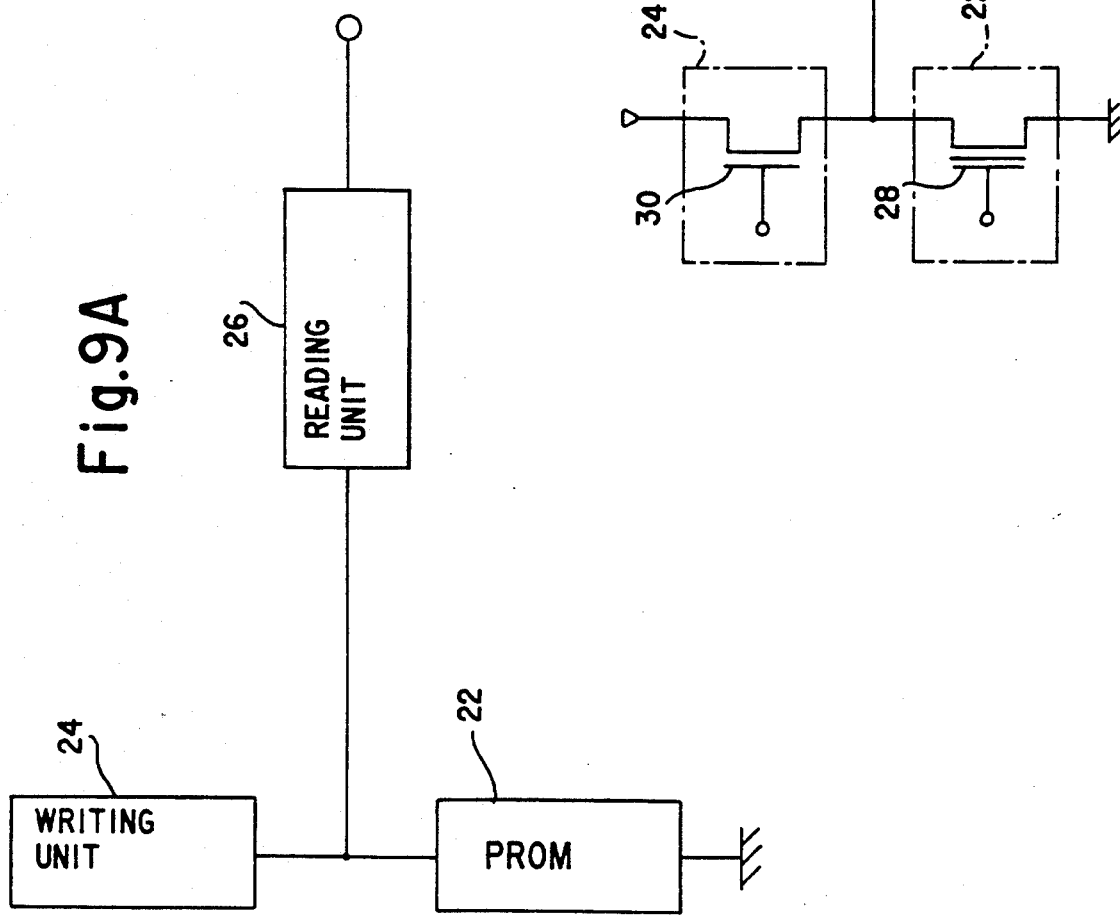
Figure 11B:
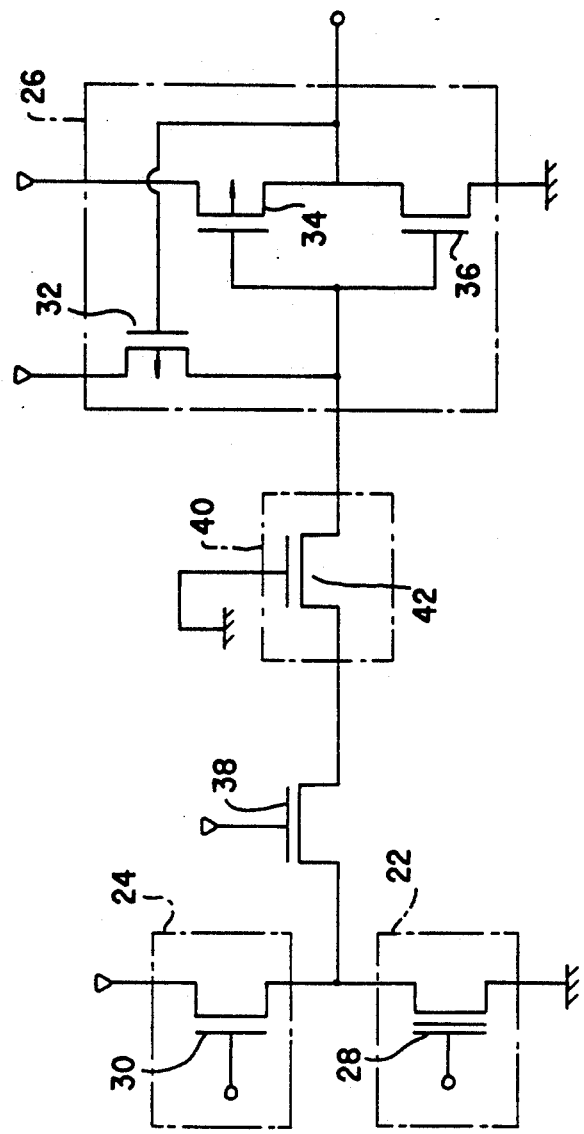
Figure 11A:
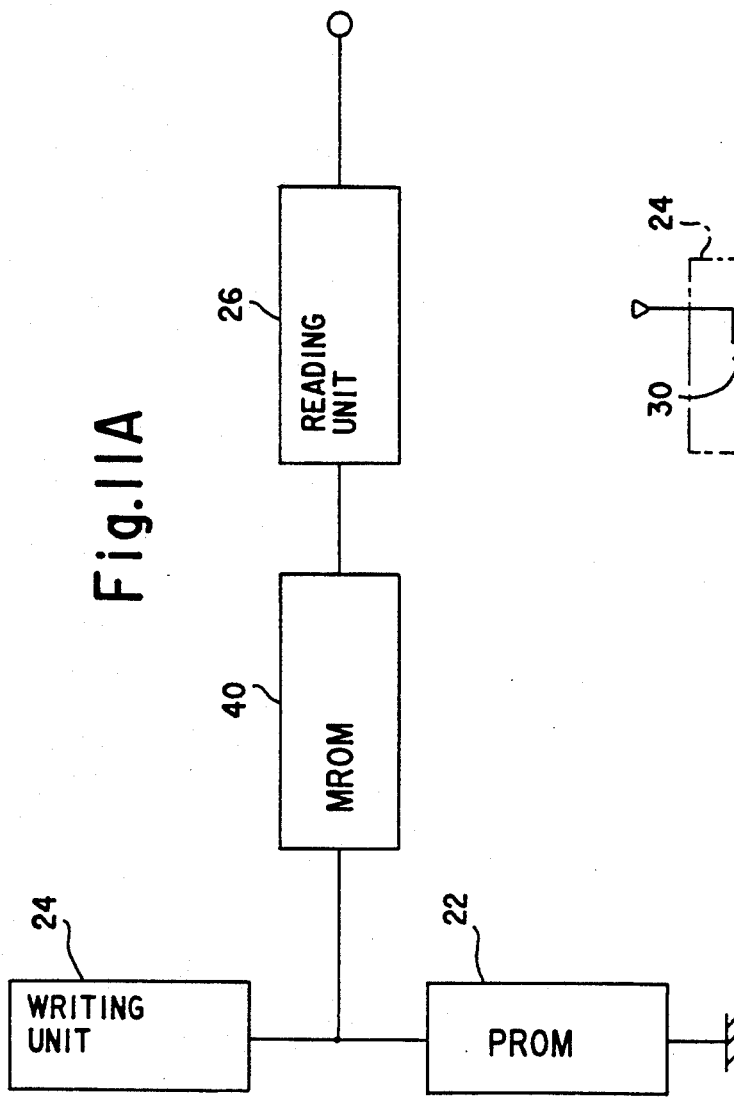
Figure 12:
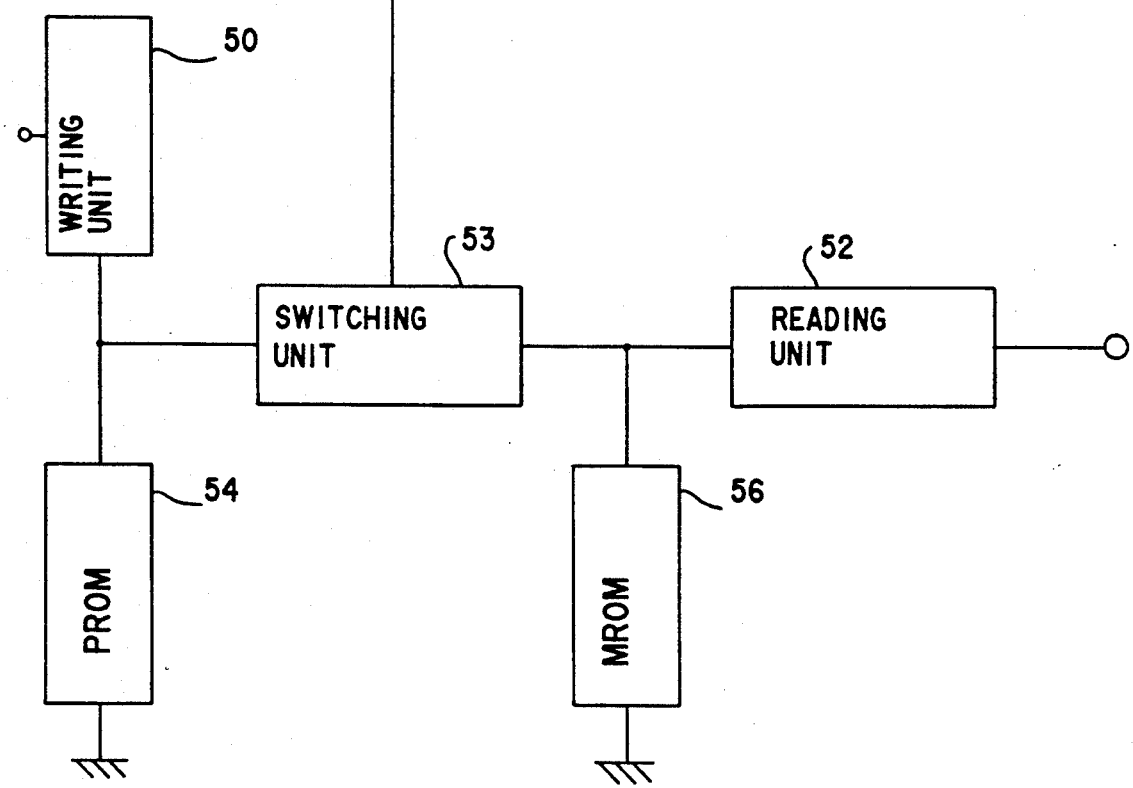
FIG. 12 is a block circuit diagram of an address storing unit according to the first embodiment of the present invention.

FIG. 12 shows the first embodiment of the present invention.

The semiconductor memory device of the present invention comprises a mask ROM 56 and a PROM 54 whose program characteristic are different and, a switching means 58 for switching the mask ROM 56 and the PROM 54. When the mask ROM 56 side is programmed by an operation of the switching means 58, the content of the mask ROM 56 side is made effective. On the other hand, when the PROM 54 side is programmed, the content of the PROM 54 side is made effective.

The following combinations of the mask ROM 56 and the PROM 54 are considered: a combination of the mask ROM 56 with a program characteristic shown by symbol A in FIG. 7 and the PROM 54 with a program characteristic shown by symbol B in FIG. 8, and a combination of the mask ROM 56 with a program characteristic shown by symbol B in FIG. 7 and the PROM 54 with a program characteristic shown by symbol A in FIG. 8.

The connection relation of the mask ROM 56, the PROM 54 and the switching means 58 can be made such that the mask ROM 56 and the PROM 54 are appropriately switched by the switching means 58. For example, where the mask ROM 56 and the PROM 54 are connected in parallel, the switching means 58 is provided between them. When the mask ROM 56 is connected in series with the PROM 54, the switching means 58 is connected in parallel with them. However, in this case it is necessary to consider a connection position of the reading means 52 and the program characteristics of the ROMs 54 and 56 so that the existence of a program can be effectively read out.

The switching means 58 can be formed of a transistor, for example, turned on or off by a switching signal supplied from another mask ROM 60.

When the mask ROM 56 is selected by the switching means 58 and the mask ROM 56 side is programmed, the content of the mask ROM 56 side is made effective. On the other hand, when the PROM 54 side is programmed, the content of the PROM 54 is made effective. Therefore, in a semiconductor memory apparatus including both a mask ROM 56 and a PROM 54 whose program characteristics are different, both the mask ROM 56 and the PROM 54 become programmable, thereby enabling the memory apparatus to operate effectively.

In FIG. 12, as stated above, 54 and 56 respectively designate a PROM and a mask ROM, 50 designates a writing unit for programming the PROM 54, and 52 designates a reading unit for reading a program in the PROM 54 or the mask ROM 56. The PROM 54 and the mask ROM 56 are connected in parallel through the switching unit 58 and the reading unit 52 is connected to the switching unit 58 and the mask ROM 56. The mask ROM 56 allows current to flow when it is programmed. On the other hand, the PROM 54 prevents current from flowing when it is programmed. The switching unit 58 performs a switching of the mask ROM 56 and the PROM 54 by a switching signal applied from the mask ROM 56 and the reading unit 62. That is, the switching unit 58 prohibits conduction between the PROM 54 and the reading unit 52 when the mask ROM 56 is programmed and allows conduction when the PROM 54 is programmed.

Figure 13:
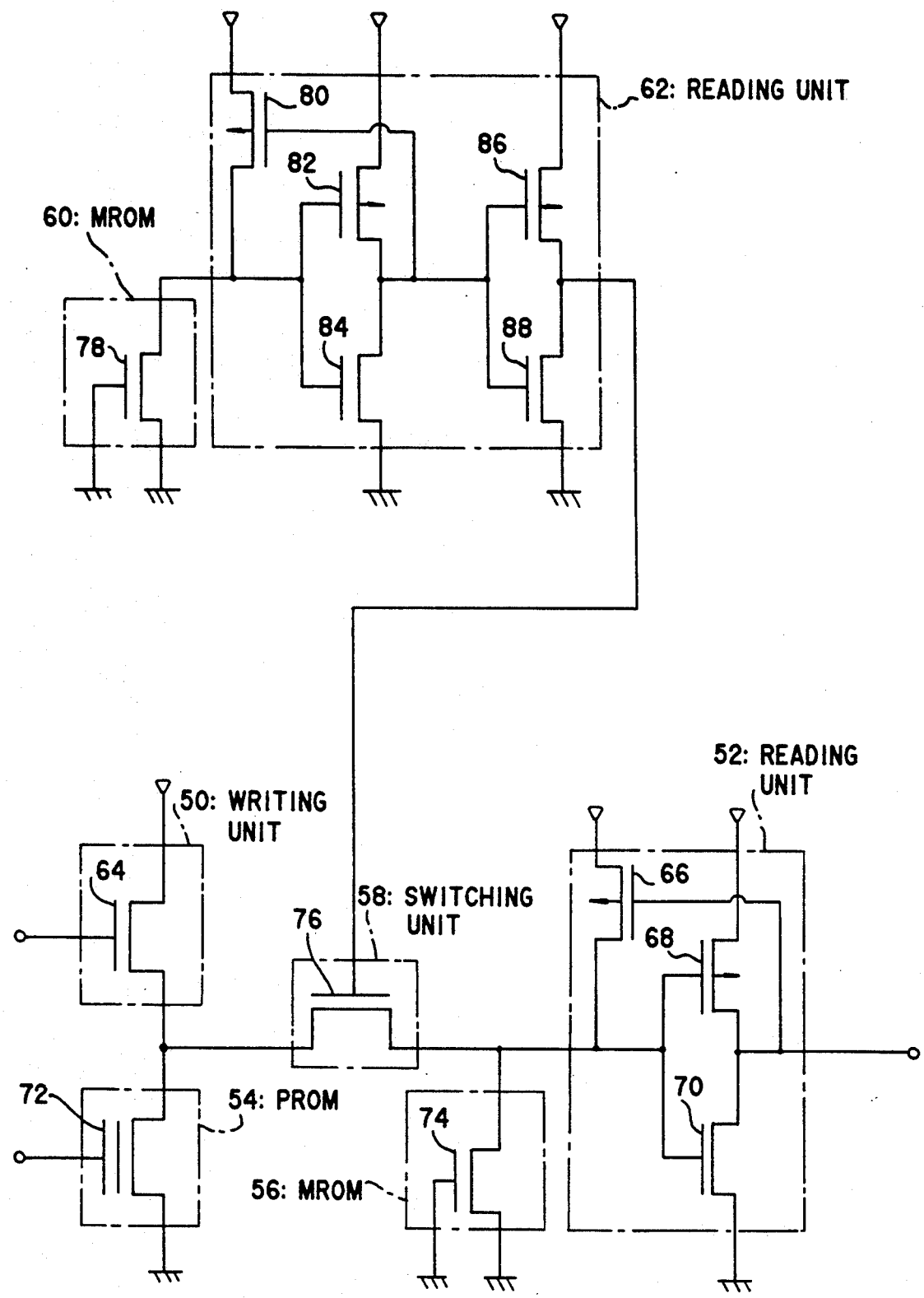
FIG. 13 is a detailed circuit diagram of an address storing unit according to the first embodiment.

FIG. 13 shows a detailed circuit diagram of the address storing unit of FIG. 12.

In FIG. 13, the writing unit 50 includes a writing transistor 64, and the reading unit 52 includes reading transistors 66, 68 and 70. The PROM 54 includes an EPROM transistor 72, the mask ROM 56 includes a mask ROM enhancement type transistor 74, and the switching unit 58 includes a switching transistor 76. The mask ROM 60 includes a mask ROM enhancement type transistor 78 and the reading unit 62 includes reading transistors 80, 82, 84, 86 and 88. The operation of the circuit in FIG. 13 is explained as follows.

When mask ROM 56 is programmed for use, mask ROM 60 is programmed to enable transistor 78 to be of the depletion type. As a result, in transistor 78 the current flows when the gate potential is at "L" level. Thus, the output of mask ROM 60, namely, the input of the reading unit 62, becomes "L" level. Therefore, the output of the reading unit 62 formed of transistors 80, 82, 84, 86 and 88 becomes "L" level. Thus, the input of the switching unit 68 becomes "L" level and transistor 76 is cut off.

Accordingly, the state of transistor 72 of the PROM 54 does not affect the operation of the reading unit 52 and the reading unit 52 can detect whether transistor 74 of mask ROM 56 is programmed.

Next, where the PROM 54 is programmed for use, mask ROM 60 is not programmed. That is, transistor 78 is not of the depletion type. As a result, in transistor 78, the gate potential is at "L" level, the current does not flow and the output of mask ROM 60, namely, the input of the reading unit 62 becomes "H" level. Therefore, the output of the reading unit 62, comprising transistors 80, 82, 84, 86 and 88, becomes "H" level. Thus, the input of the switching unit 58 becomes "H" level, thereby enabling transistor 76 to be in the ON state. At this time, transistor 74 of mask ROM 56 is not programmed and is kept in the OFF state.

In the above state, when the gate potential of transistor 64 of the writing unit 50 and the gate potential of transistor 72 of the PROM 54 are high (Vpp), a charge is injected to the floating gate of transistor 72 of the PROM 54, thus programming the PROM 54. In this state, threshold value voltage VTH of transistor 72 of the PROM 54 is high. As a result, even when the gate potential of transistor 72 is at "H" level, transistor 72 is not turned ON. On the other hand, when a charge is not injected into the floating gate of transistor 72 of the PROM 54 and the PROM 54 is not programmed, transistor 72 turns on when its gate potential becomes "H" level.

Accordingly, the reading unit 52 detects the state of transistor 72 of the PROM 54, and thus detects whether transistor 72 is programmed. When the reading unit 52 performs this detection operation, transistor 76 of the switching unit 58 operates as a transfer gate and upon writing the data, it prevents a high voltage (Vpp) from being input to the reading unit 52 and mask ROM 56, thereby preventing transistors 66, 68, 70 and 74 from being destroyed.

Figure 14:
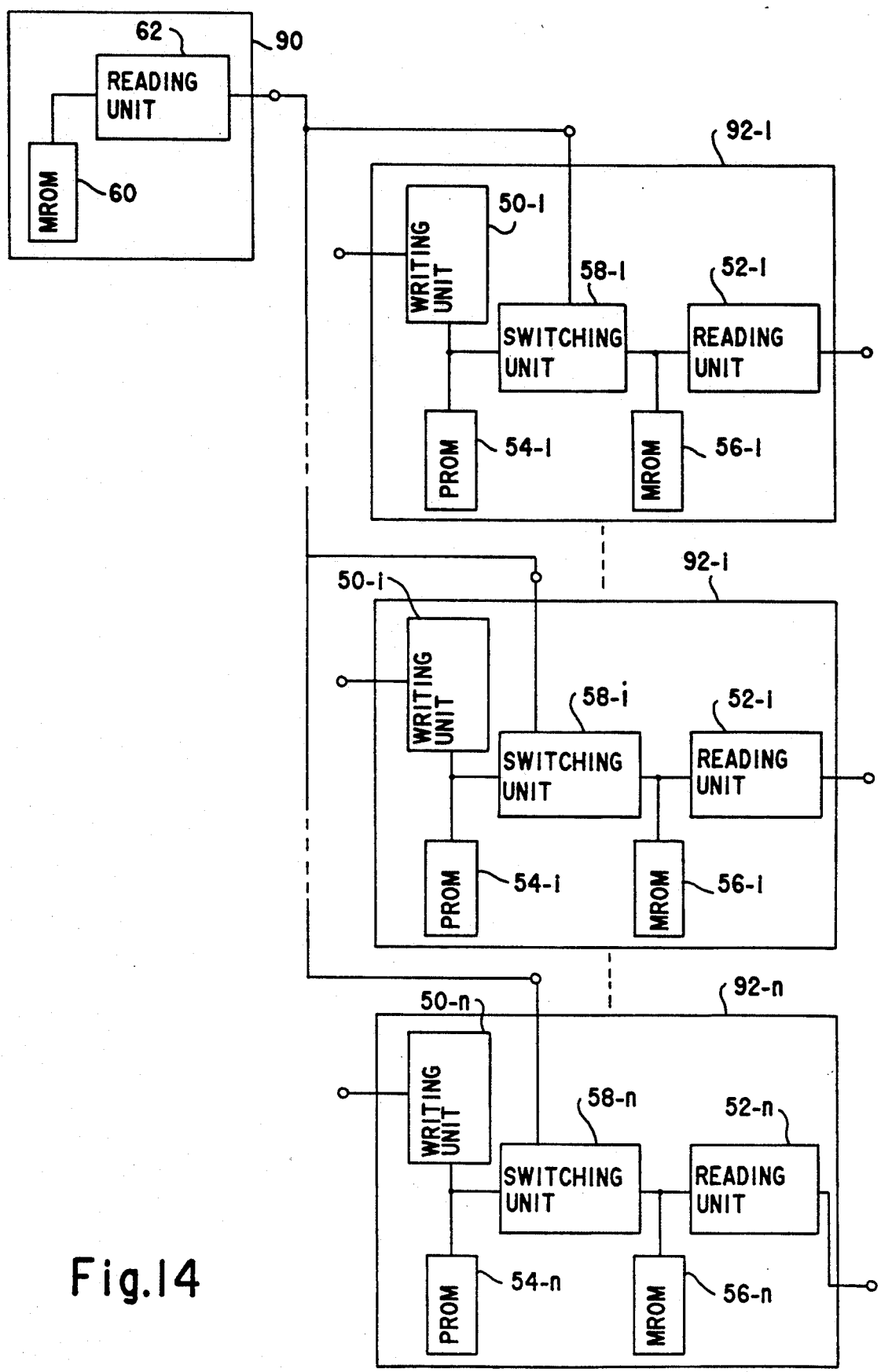
FIG. 14 is a block diagram of an address storing unit according to a second embodiment of the present invention.

Next, FIG. 14 shows the address storing unit of the second embodiment of the present invention.

A plurality of memory circuits is required for storing address information and an address storing unit is formed as shown in FIG. 14. In FIG. 14, block 90 includes a mask ROM 60 and a reading unit 62, and blocks 92-1 to 92-i to 92-n are formed in the same manner. Block 92-i includes a writing unit 50-i, a reading unit 52-i, a PROM 54-i, a mask ROM 56-i and a switching unit 58-i (i=1..., n). Here, respective blocks 92-1 to 92-n necessitate a number of bits to form address data and where, for example, as an address of 12 bits (as shown in FIGS. 4 and 5) are dealt with, 12 blocks (n=12) are necessary. In this case, the values (1 or 0) corresponding to A8–A19 in FIGS. 4 or 5 are stored in blocks 92-1 to 92-12.

In this embodiment, the switching signal from the reading unit 62 simultaneously controls switching units 58-1 to 58-n of respective block 92-1 to 92-n. That is, PROMs 54-1 to 54-n or mask ROMs 56-1 to 56-n become programmable.

Figure 15:
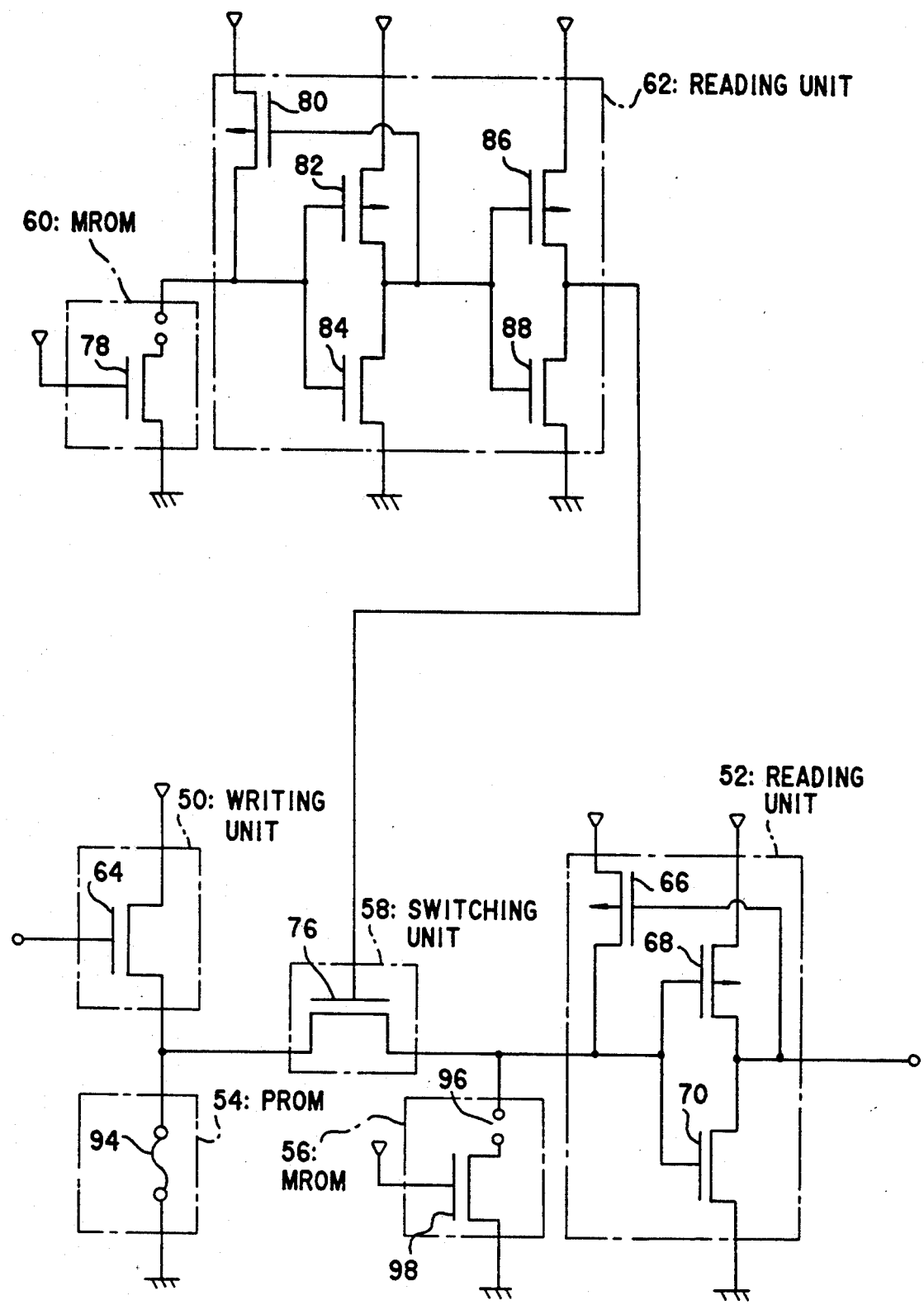
FIG. 15 shows a detailed circuit diagram of an address storing unit according to a third embodiment of the present invention.

Next, FIG. 15 shows an address storing unit according to the third embodiment of the present invention.

In FIG. 15, a PROM 54 is formed of a fuse 94, and a mask ROM 56 is formed of a contact 96 and a transistor 98. The other members are the same as those of FIG. 13. In order to program the PROM 54, the fuse 94 is merely cut off, thus preventing the flow of current. To program the mask ROM 56, the contact 96 is connected, thereby allowing the flow of current. The switching unit 58 is controlled in the same manner as in the embodiment shown in FIG. 13.

In the present embodiment, the same operation and effect as that of the address storing unit in FIG. 13 can be achieved.

Figure 16:
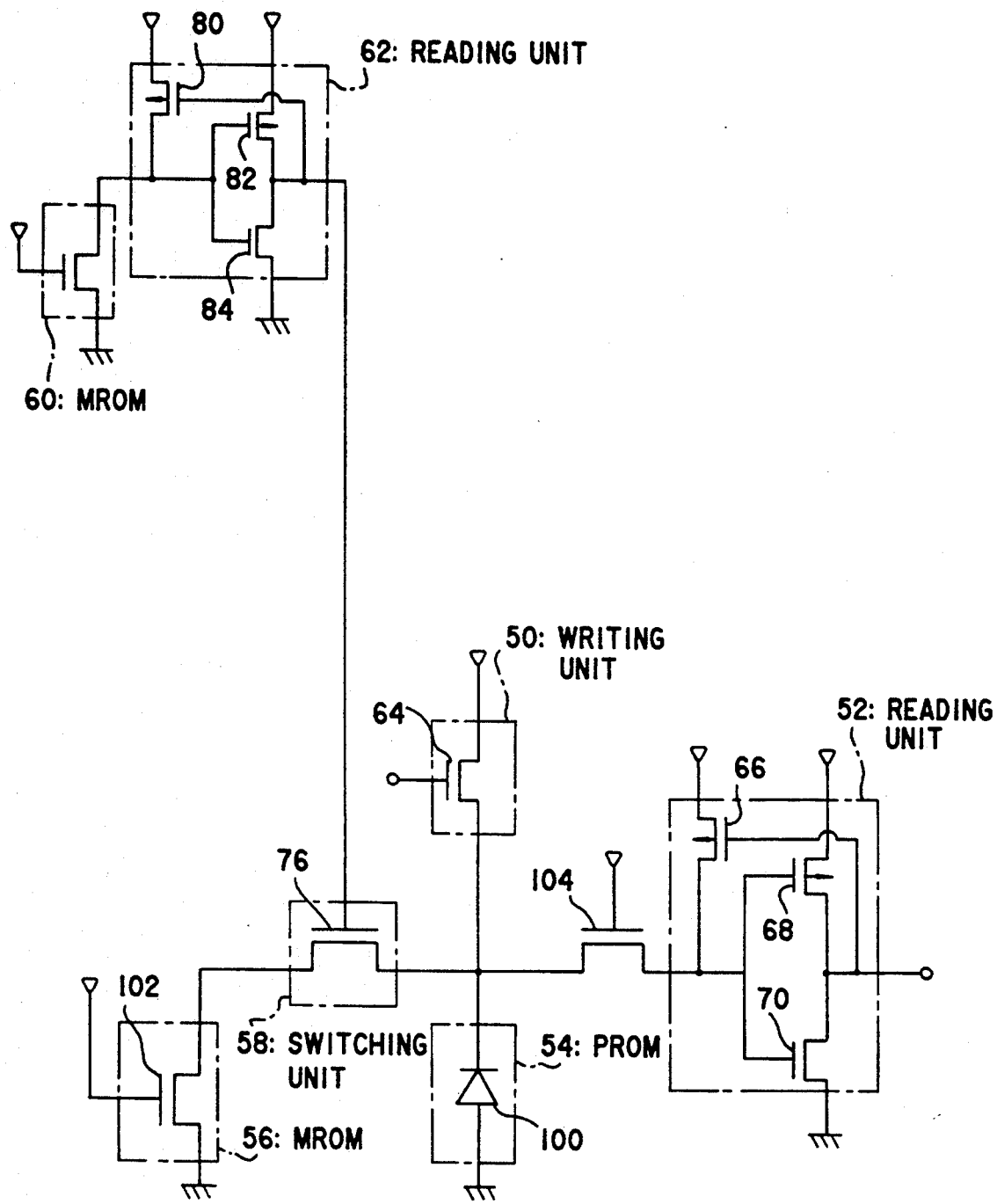
FIG. 16 shows a detailed circuit diagram of an address storing unit according to a fourth embodiment of the present invention.

FIG. 16 designates an address storing unit according to the fourth embodiment of the present invention.

As shown in FIG. 16, the PROM 54 is formed of a PN junction destroying type element (PN junction diode) 100 and the mask ROM 56 is formed of a transistor 102 of the ion injection type (high Vth).

To program the PROM 54, the PN junction of the element 100 is destroyed, thereby allowing current to flow. To program mask ROM 56, ion implantation is performed on transistor 102, thereby preventing current from flowing. That is, the PROM 54 is turned on by the programming and the mask ROM 56 is turned off by the programming. As shown in FIG. 16, the positional relationship between the PROM 54 and the mask ROM 56 is opposite to that in FIG. 13. A reading unit 52 is provided at the connection point of the switching unit 58 and the PROM 54. In this case, when the PROM 54 is programmed, the switching unit 58 is switched to the non-conductive state. On the other hand, when the mask ROM 56 is programmed, the switching unit 58 is switched to the conductive state. Transistor 104, provided at the pre-stage of reading unit 52, prevents a high voltage from being applied to the input of the reading unit 52 upon writing a program to the PROM 54.

In the above embodiment, parallel connection of the PROM 54 and the mask ROM 56 is described, but the present invention can be applied to a series connection of the PROM 54 and the mask ROM 56.

For example, as shown in FIG. 17, the PROM 54, the mask ROM 56, and the reading circuit 52 are connected in series, the switching unit 58 is connected in parallel with the PROM 54, and the switching unit 58 is appropriately switched and controlled, thereby making both the PROM 54 and the mask ROM 56 programmable. In this case, however, a mask ROM 56 of a type that prevents current flow by the program (as shown by a symbol B in FIG. 7, for example) and a PROM 54 of a type that allows current flow by a program (as shown by symbol A in FIG. 8 for example) is used. When the mask ROM 56 is programmed, the PROM 54 is short-circuited by the switching unit 58.

As shown in FIG. 18, the positions of the PROM 54 and the mask ROM 56 may be exchanged. In this case, however, a PROM 54 type preventing current flow by the program (as shown by symbol B in FIG. 8, for example) and a mask ROM 56 type allowing current flow by the program (as shown by symbol A in FIG. 7, for example) are used. When the PROM 54 is programmed, the mask ROM 56 is short circuited by the switching unit 58.

The above described embodiment of the present invention is applied to the address storing unit and the present invention can be applied to various kinds of semiconductor memory devices having mask ROMs and PROMs whose program characteristics are different, as well as the above described address storing unit. For example, the present invention can be applied to a storing unit for storing data concerning whether a particular ROM is put in an in-use state or a not-yet-in-use state or the storing unit for storing a selection of an input and output terminal.

What is claimed is:

1. A semiconductor memory device comprising:
   a first ROM being in an ON state when said first ROM is programmed and a second ROM being in an OFF state when said second ROM is programmed;
   switching means for switching a current path for selectively reading contents of one of said first ROM and said second ROM, said contents stored as one of an ON state and an OFF state; and
   means for selectively reading the content of said first ROM when said first ROM is programmed under control of said switching means and for selectively reading the content of said second ROM when said second ROM is programed.

2. The semiconductor memory device according to claim 1, wherein
   said first ROM and said second ROM are connected in parallel through said switching means and said device further comprises a reading means, connected to a connection point connecting said switching means and said first ROM, for detecting whether said first ROM or said second ROM is programmed.

3. The semiconductor memory device according to claim 1, wherein
   said first ROM and said second ROM are connected in series and said first ROM is connected in parallel with said switching means and said device further comprises reading means, connected to a terminal of said second ROM, for detecting whether said first ROM or said second ROM is programmed.

4. The semiconductor memory device according to claim 3, wherein
   said first ROM comprises an enhancement type transistor and is programmed by making said enhancement type transistor into a depletion type transistor by injecting ions into said enhancement type transistor.

5. The semiconductor memory device according to claim 3, wherein
   said first ROM has a contact unit for programming said first ROM when said contact unit is switched to an active state.

6. The semiconductor memory device according to claim 3, wherein
   said first ROM has an insulating area, said first ROM being programmed by forming an impurity diffusion layer in said insulating area by injecting ions therein.

7. The semiconductor memory device according to claim 3, wherein
   said second ROM comprises an EPROM transistor and a charge is injected into a floating gate of said EPROM transistor, thereby enabling said EPROM transistor to be programmed.

8. The semiconductor memory device according to claim 3, wherein
   said second ROM comprises a fuse and the fuse is cut, thereby enabling said second ROM to be programmed.

9. The semiconductor memory device according to claim 1, wherein
   said first ROM and said second ROM are connected in parallel through said switching means and said device further comprises reading means, connected to a connection point connecting said switching means and said second ROM, for detecting whether said first ROM or said second ROM is programmed.

10. The semiconductor memory device according to claim 1, wherein
    said switching means is electrically connected to one of said first ROM and said second ROM by a switching signal supplied from a third ROM of a same type as said first ROM.

11. The semiconductor memory device according to claim 10, wherein
    said switching means comprises a transistor which turns on or off based on the switching signal supplied from said third ROM.

12. The semiconductor memory device according to claim 1, wherein
    said first ROM comprises a mask ROM and said second ROM comprises a PROM.

13. The semiconductor memory device according to claim 1, wherein said first and second ROM and said switching means forming a unit and wherein
    a plurality of units are provided.

14. A semiconductor memory device comprising:
    a first ROM being in an OFF state when said first ROM is programmed and a second ROM being in an ON state when said second ROM is programmed;
    switching means for programing said first ROM and said second ROM based on switching signals; and
    means for selectively reading content of said first ROM when said first ROM is programmed under control of said switching means and for selectively reading content of said second ROM when said second ROM is programmed.

15. The semiconductor memory device according to claim 14, wherein
said first ROM and said second ROM are connected in series and said switching means is connected in parallel with said second ROM and said device further comprises reading means, connected to a terminal of said first ROM, for detecting whether said first ROM or said second ROM is programmed.

16. The semiconductor memory device according to claim 15, wherein
said first ROM comprises a transistor and is programmed by increasing a threshold voltage of said transistor by injecting ions into said transistor, therein performing an ion implantation into said transistor.

17. The semiconductor memory device according to claim 15, wherein
said second ROM has a PN junction unit and is programmed by destroying said PN junction unit.

18. The semiconductor memory device according to claim 15, wherein
said second ROM has an insulation layer and is programmed by making said insulation layer non-insulating therein switching said second ROM from an OFF state to an ON state.

19. The semiconductor memory device according to claim 14, wherein
said switching means is electrically connected to one of said first ROM and said second ROM based upon said switching signals supplied from a third ROM of a same type as said first ROM.

20. The semiconductor memory device according to claim 19, wherein
said switching means comprises a transistor which turns on or off based on the switching signal supplied from said third ROM.

21. The semiconductor memory device according to claim 14, wherein
said first ROM comprises a mask ROM and said second ROM comprises a PROM.

22. The semiconductor memory device according to claim 14, wherein said first and second ROM and said switching means forming a unit and
a plurality of units are provided.

* * * * *